United States Patent
Yang et al.

(10) Patent No.: US 7,495,281 B2
(45) Date of Patent: Feb. 24, 2009

(54) NON-VOLATILE MEMORY DEVICE AND METHODS OF FORMING AND OPERATING THE SAME

(75) Inventors: Seung-Jin Yang, Seoul (KR); Jeong-Uk Han, Suwon-si (KR); Kwang-Wook Koh, Seoul (KR); Jae-Hwang Kim, Yongin-si (KR); Sung-Chul Park, Gwacheon-si (KR); Ju-Ri Kim, Seoul (KR)

(73) Assignee: Samsung Electronics Co., Ltd. (KR)

( * ) Notice: Subject to any disclaimer, the term of this patent is extended or adjusted under 35 U.S.C. 154(b) by 202 days.

(21) Appl. No.: 11/488,983

(22) Filed: Jul. 19, 2006

(65) Prior Publication Data

US 2007/0023820 A1      Feb. 1, 2007

(30) Foreign Application Priority Data

Jul. 29, 2005   (KR) ...................... 10-2005-0069564

(51) Int. Cl.
*H01L 29/788* (2006.01)
(52) U.S. Cl. ................ 257/315; 257/316; 257/319; 257/E29.304
(58) Field of Classification Search ......... 257/314–316, 257/319, 320, E29.129, E29.304
See application file for complete search history.

(56) References Cited

U.S. PATENT DOCUMENTS

| | | | | |
|---|---|---|---|---|
| 5,235,544 A | * | 8/1993 | Caywood | 365/185.26 |
| 5,284,784 A | * | 2/1994 | Manley | 438/263 |
| 5,402,371 A | * | 3/1995 | Ono | 365/185.07 |
| 6,222,226 B1 | | 4/2001 | Lim | 257/316 |
| 6,355,524 B1 | * | 3/2002 | Tuan et al. | 438/257 |
| 6,438,028 B1 | * | 8/2002 | Kobayashi et al. | 365/185.05 |
| 6,894,339 B2 | | 5/2005 | Fan et al. | |

FOREIGN PATENT DOCUMENTS

KR   10-2000-0076924    12/2000
KR   10-2001-0036727    5/2001

* cited by examiner

*Primary Examiner*—Tuan N. Quach
(74) *Attorney, Agent, or Firm*—Mills & Onello, LLP

(57) ABSTRACT

In a non-volatile memory device and methods of forming and operating the same, one memory transistor includes sidewall selection gates covering both sidewalls of a floating gate when the floating gate and a control gate are stacked. The sidewall selection gates are in a spacer form. Since the sidewall selection gates are in a spacer form on the sidewall of the floating gate, the degree of integration of cells can be improved. Additionally, since the sidewall selection gates are disposed on both sidewalls of the floating gate, a voltage applied from a bit line and a common source line can be controlled and thus conventional writing/erasing errors can be prevented. Therefore, distribution of threshold voltage can be improved.

10 Claims, 10 Drawing Sheets

NON-VOLATILE MEMORY DEVICE AND METHODS OF FORMING AND OPERATING THE SAME

CROSS-REFERENCE TO RELATED PATENT APPLICATION

This application claims priority to Korean Patent Application No. 10-2005-0069564, filed on Jul. 29, 2005, in the Korean Intellectual Property Office, the contents of which are incorporated herein by reference in their entirety.

BACKGROUND OF THE INVENTION

1. Field of the Invention

The present invention relates to a semiconductor device and methods of forming and operating the same, and more particularly, to a non-volatile memory device and methods of forming and operating the same.

2. Description of the Related Art

In a non-volatile memory device, the structure of an Electrically Erasable Programmable Read-Only Memory (EEPROM) cell includes one memory transistor and one select transistor positioned between a common source line and a bit line. The memory transistor includes a floating gate that stores charge, a control gate formed on the top of the floating gate to control the floating gate, and a tunnel insulation layer that operates as a path through which charge migrates by Fowler-Nordheim (F-N) tunneling during writing and erasing operations. The select transistor serves to deliver a voltage applied from a bit line to the memory transistor during writing and erasing operations. The memory transistor and the select transistor make a pair and are symmetrically disposed with respect to a common source line. That is, two adjacent memory transistors are configured to share the common source line therebetween. During the writing and erasing of a selected transistor, a disturbance can occur, where an unselected memory transistor sharing the common source line can inadvertently become written to or erased. As a result, distribution of a threshold voltage becomes faulty.

To prevent such faulty distribution, a structure can be introduced, in which an additional select transistor is disposed between the memory transistor and the common source line to control a voltage applied from the common source line. However, since three transistors are required for this structure, the degree of device integration deteriorates.

SUMMARY OF THE INVENTION

The present invention provides a non-volatile memory device capable of improving distribution of threshold voltage while improving the degree of cell integration.

In one aspect, the present invention is directed to a non-volatile memory device comprising a plurality of memory cell transistors, wherein each of the memory cell transistors comprises: a first gate insulation layer on a semiconductor substrate; a floating gate on the first gate insulation layer; a second gate insulation layer covering a top and sidewalls of the floating gate; a first sidewall selection gate on the second gate insulation layer at a first sidewall of the floating gate; a second sidewall selection gate on the second gate insulation layer at a second sidewall of the floating gate; an inter-gate dielectric layer on the first sidewall selection gate, the second gate insulation layer and the second sidewall selection gate; a control gate overlapping the floating gate on the inter-gate dielectric layer; a source region in the semiconductor substrate adjacent the first sidewall selection gate and spaced apart from the floating gate; and a drain region in the semiconductor substrate adjacent the second sidewall selection gate and spaced apart from the floating gate.

In one embodiment, the first gate insulation layer under the first and second sidewall selection gates is thicker than the first gate insulation layer under the floating gate.

In another embodiment, the second gate insulation layer is interposed between the first gate insulation layer and the first sidewall selection gate and between the first gate insulation layer and the second sidewall selection gate.

In another embodiment, the first and second sidewall selection gates are formed of the same material and have a spacer shape.

In another embodiment, the plurality of memory cell transistors are arranged in a row direction and in a column direction; the drain regions of the memory cell transistors arranged in a row are connected to compose a bit line; the first sidewall selection gates of the memory cell transistors arranged in a column are connected to compose a first sidewall selection gate line; the second sidewall selection gates of the memory cell transistors arranged in a column are connected to compose a second sidewall selection gate line; the control gates of the memory cells arranged in a column compose a word line; and the source regions arranged in a column are connected to compose a common source line.

In another embodiment, at least one of the first sidewall selection gate line and the second sidewall selection gate line is divided into a predetermined number of the memory cell transistor units.

In another aspect, the present invention is directed to a non-volatile memory device comprises: a semiconductor substrate; a gate insulation layer, a floating gate, an inter-gate dielectric layer, and a control gate sequentially stacked on the semiconductor substrate; and first and second sidewall selection gates respectively covering sidewalls of the floating gate and insulated from the semiconductor substrate and the floating gate. At least one of the first and second sidewall selection gates forms a channel on the semiconductor substrate during a device operation.

In another aspect, the present invention is directed to a method of forming a non-volatile memory device, comprising: forming a device isolation layer on a semiconductor substrate to define an active region; forming a first gate insulation layer on the active region; forming a floating gate pattern crossing over the active region and the device isolation layer on the first gate insulation layer; forming a second gate insulation layer covering a top and sidewalls of the floating gate pattern; forming a first sidewall selection gate line and a second sidewall selection gate line covering sidewalls of the second gate insulation layer at first and second sidewalls of the floating gate pattern, respectively; forming a floating gate on the active region by removing the second gate insulation layer and the floating gate pattern on the device isolation layer; forming an inter-gate dielectric layer; and forming a control gate line covering the inter-gate dielectric layer between the first sidewall selection gate line and the second sidewall selection gate line.

In one embodiment, forming of the control gate line comprises: forming a sacrificial layer having an opening on the inter-gate dielectric layer, the opening exposing the inter-gate dielectric layer between the first sidewall selection gate line and the second sidewall selection gate line; forming a control gate layer filling the opening; removing the control gate layer on the sacrificial layer using a planarization process to expose the sacrificial layer and to form a control gate line inside the opening at the same time; and removing the sacrificial layer.

In another embodiment, forming of the first sidewall selection gate line and the second sidewall selection gate line comprises: forming a sidewall selection gate layer on the second gate insulation layer; and performing an anisotropic etching process with respect to the sidewall selection gate layer.

In another embodiment, the method further comprises: forming a spacer at sidewalls of the control gate line and the inter-gate dielectric layer; and forming a source region and a drain region on the active region using the spacer and the control gate line as ion implantation masks.

In another embodiment, the first and the second gate insulation layers are formed of a thermal oxide layer, and the inter-gate dielectric layer is formed of a double layer of a nitride layer and an oxide layer.

In another aspect, the present invention is directed to a method of operating a non-volatile memory device having a plurality of memory cell transistors, each of the memory cell transistors comprising a first gate insulation layer on a semiconductor substrate, a floating gate on the first gate insulation layer, a second gate insulation layer covering a top and sidewalls of the floating gate, a first sidewall selection gate covering the second gate insulation layer at a first sidewall of the floating gate, a second sidewall selection gate covering the second gate insulation layer at a second sidewall of the floating gate, an inter-gate dielectric layer conformally covering a sidewall of the first sidewall selection gate, a top of the second gate insulation layer, and a sidewall of the second sidewall selection gate, and a control gate overlapping the floating gate on the inter-gate dielectric layer, the method comprising: (a) injecting charge into the floating gate through the first gate insulation layer; (b) sensing a variation of a threshold voltage of a channel region under the floating gate by charge stored in the floating gate; and (c) inducing tunneling of the charge stored in the floating gate toward one of the first and second sidewall selection gate lines through the second gate insulation layer.

In one embodiment, in the operation (a), hot carriers are injected through the first gate insulation layer by applying a ground voltage to the source region, a bias voltage to the drain region, an erase voltage to the control gate, and a turn-on voltage to the first and second side selection gates.

In another embodiment, in the operation (c), tunneling of charge is induced through the second gate insulation layer by applying a ground voltage to one of the first and second sidewall selection gates, an erase voltage to the other of the first and second sidewall selection gates, and a ground voltage to the control gate, and floating the source region and the drain region.

In another embodiment, in the operation (b), information stored in the floating gate is sensed by applying a turn-on voltage to the first and second sidewall selection gates, a reference voltage to the control gate, a read voltage to the drain region, and a ground voltage to the source region.

In another embodiment, the plurality of non-volatile memory cell transistors are arranged in a row direction and in a column direction; the drain regions of the memory cell transistors arranged in a row are connected to compose a bit line; the first sidewall selection gates of the memory cell transistors arranged in a column are connected to compose a first sidewall selection gate line; the second sidewall selection gates of the memory cell transistors arranged in a column are connected to compose a second sidewall selection gate line; the control gates of the memory cells arranged in a column composes a word line; the source regions arranged in a column are connected to compose a common source line; wherein the first sidewall selection gate line or the second sidewall selection gate line is divided into a predetermined number of memory cell transistor units; and wherein the operations (a) and (c) are performed in the predetermined number of memory cell transistor units.

In another embodiment, in the operation (a), a ground voltage, a bias voltage and an erase voltage are respectively applied to a selected common source line, bit line and word line, and ground voltage is applied to an unselected common source line, bit line, word line, first sidewall selection gate line, and second sidewall selection gate line.

In another embodiment, in the operation (c), a selected common source line and bit line are floated; a ground voltage is applied to one of the first and second sidewall selection gate lines; an erase voltage is applied to the other of the first and second sidewall selection gate lines; and a ground voltage is respectively applied to an unselected common source line, bit line, word line, first sidewall selection gate line, and second sidewall selection gate line.

In another embodiment, in the operation (b), a turn-on voltage is applied to selected first and second sidewall selection gate lines; a reference voltage, a read voltage, and a ground voltage are respectively applied to a selected control gate, bit line, and common source line; and a ground voltage is respectively applied to an unselected common source line, bit line, word line, first sidewall selection gate line, and second sidewall selection gate line.

In another aspect, the present invention is directed to a method of forming a non-volatile memory device, comprising: forming a first gate insulation layer on a semiconductor substrate; forming a floating gate on the first gate insulation layer; forming a second gate insulation layer covering a top and both sides of the floating gate; forming a first sidewall selection gate on the second gate insulation layer, the first sidewall selection gate covering a first sidewall of the floating gate; forming a second sidewall selection gate on the second gate insulation layer, the second sidewall selection gate covering a second sidewall of the floating gate; forming an inter-gate dielectric layer on the first sidewall selection gate, the second gate insulation layer and the second sidewall selection gate; forming a control gate overlapping the floating gate on the inter-gate dielectric layer; forming a source region in the semiconductor substrate adjacent the first sidewall selection gate and spaced apart from the floating gate; and forming a drain region in the semiconductor substrate adjacent the second sidewall selection gate and spaced apart from the floating gate.

BRIEF DESCRIPTION OF THE DRAWINGS

The foregoing and other objects, features and advantages of the invention will be apparent from the more particular description of preferred embodiments of the invention, as illustrated in the accompanying drawings in which like reference characters refer to the same parts throughout the different views. The drawings are not necessarily to scale, emphasis instead being placed upon illustrating the principles of the invention. In the drawings.

DETAILED DESCRIPTION OF THE INVENTION

Figure 1A:
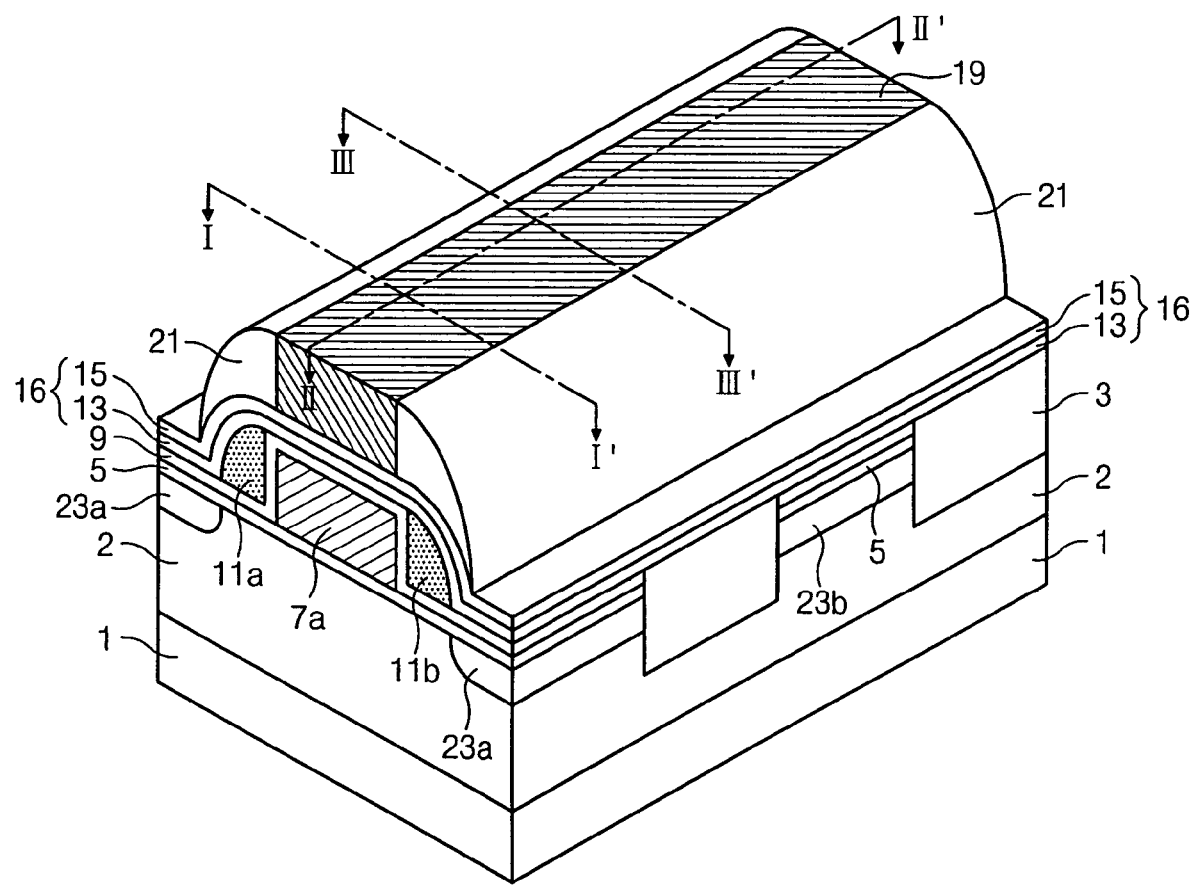
FIG. 1A is a perspective view of a non-volatile memory device according to an embodiment of the present invention.

Reference will now be made in detail to the preferred embodiments of the present invention, examples of which are illustrated in the accompanying drawings. However, the present invention is not limited to the embodiments illustrated herein after, and the embodiments herein are rather introduced to provide ready and complete understanding of the scope and spirit of the present invention. In the drawings, the thickness of films and regions are exaggerated for clarity. In the drawings, the thickness of films and regions are exaggerated for clarity. It will also be understood that when a film is referred to as being on another film or substrate, it can be directly on the other film or substrate, or intervening films may also be present. Like reference numerals in the drawings denote like elements.

Figure 1B:
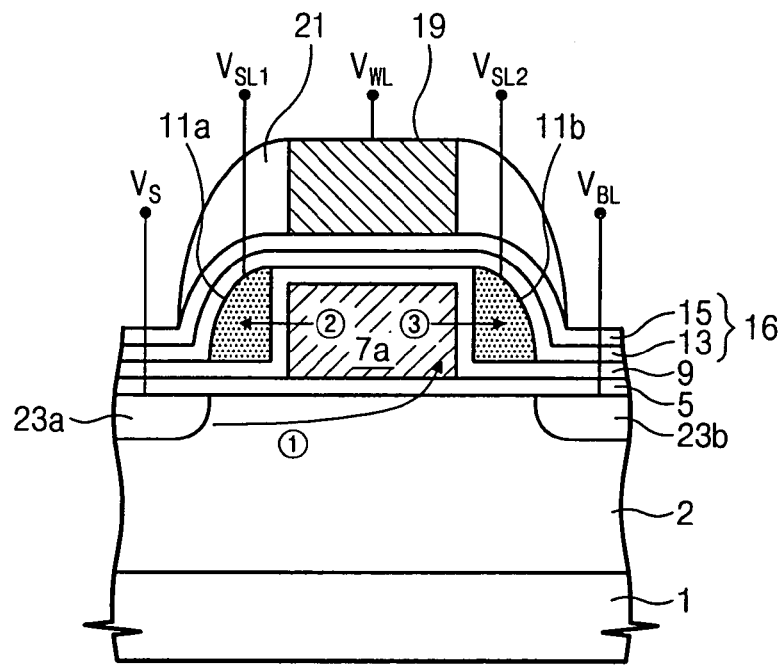
FIG. 1B is a sectional view taken along section line of I-I' of FIG. 1A.
Figure 1C:
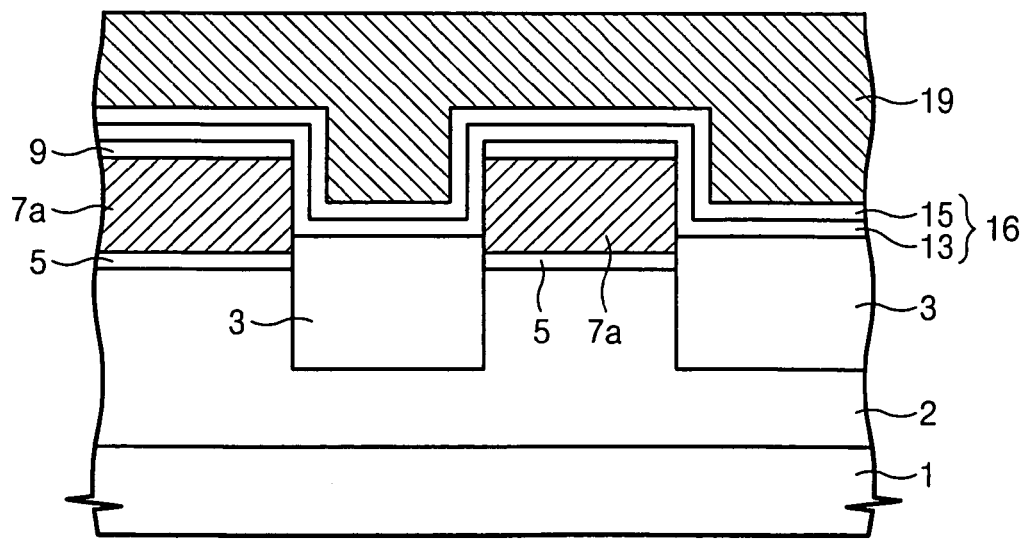
FIG. 1C is a sectional view taken along section line of II-II' of FIG. 1A.
Figure 1D:
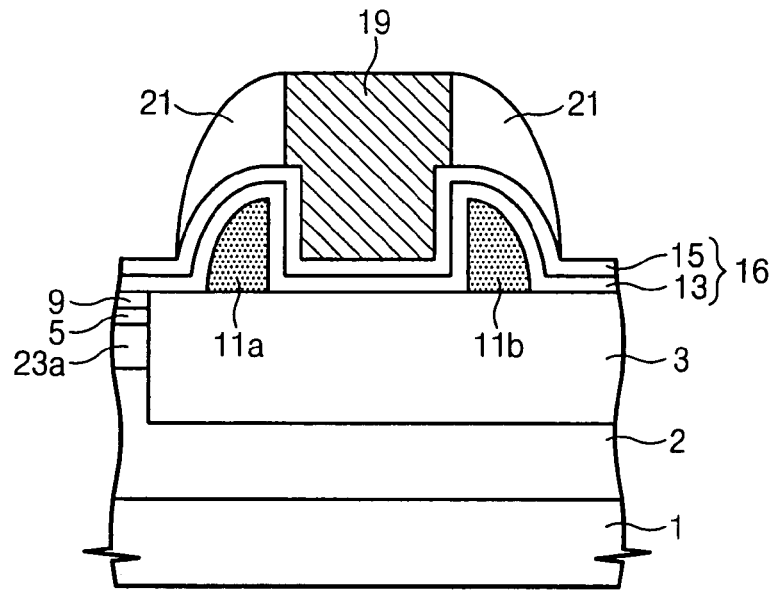
FIG. 1D is a sectional view taken along section line of III-III' of FIG. 1A.

FIG. 1A is a perspective view of a non-volatile memory device according to an embodiment of the present invention. FIG. 1B is a sectional view taken along section line of I-I' of FIG. 1A. FIG. 1C is a sectional view taken along section line of II-II' of FIG. 1A. FIG. 1D is a sectional view taken along section line of III-III' of FIG. 1A.

Referring to FIGS. 1A to 1D, a device isolation layer 3 is disposed on a semiconductor substrate 1 on which a well 2 is formed to define an active region. A first gate insulation layer 5 is formed on the semiconductor substrate 1 of the active region and a plurality of floating gates 7a spaced apart from each other are disposed on the first gate insulation layer 5. The floating gate 7a is not disposed on the device isolation layer 3. The top and both sidewalls of the floating gate 7a are covered with a second gate insulation layer 9. The second gate insulation layer 9 can be extended to cover the first gate insulation layer 5 adjacent to the floating gate 7a. The first gate insulation layer 5 and the second gate insulation layer 9 are formed, for example, of an oxide layer or a thermal oxide layer using a deposition process, e.g. chemical vapor deposition (CVD). When the first and second gate insulation layers 5 and 9 are formed of the thermal oxide layer, a boundary therebetween is ambiguous. Thus, the first gate insulation layer 5 adjacent to the floating gate 7a may operate as a single, thick layer.

Referring to FIGS. 1A to 1D, a first sidewall selection gate line 11a and a second sidewall selection gate line 11b, which cover a sidewall of the second gate insulation layer 9 on both sides of the floating gates 7a, cross over the active region and the device isolation layers 3 in a direction of the II-II' section line. An inter-gate dielectric layer 16 formed of a double layer of a silicon nitride layer and a silicon oxide layer 15 covers sidewalls of the first and second sidewall selection gate lines 11a and 11b, sidewalls facing the two floating gates 7a with the device isolation layer 3 therebetween, the top of the device isolation layer between the two floating gates 7a, and the second gate insulation layer 9 adjacent to the first and second sidewall selection gate lines 11a and 11b. Additionally, a word line 19 is disposed in parallel with the first and second sidewall selection gate lines 11a and 11b to cover the top of the floating gates 7a. The word line 19 is not overlapped with the first and second sidewall selection gate lines 11a and 11b. Sidewalls of the word line 19 and the inter-gate dielectric layer 16 are covered with spacers 21. Moreover, a source region 23a and a drain region 23b are formed on the semiconductor substrate 1 adjacent to the first and the second sidewall selection gate lines 11a and 11b.

Next, one memory cell transistor of the present invention includes the one floating gate 7a, the source region 23a and the drain region 23b adjacent to the one floating gate 7a, first and second sidewall selection gate lines 11a and 11b, and the word line 19. Here, the first and second sidewall selection gate lines 11a and 11b can be referred to as a first sidewall selection gate and a second sidewall selection gate, respectively. The word line 19 can be referred to as a control gate. Since the two floating gates 7a are illustrated in FIGS. 1A and 1C, two memory cell transistors are shown. Although not illustrated, the memory cell transistors are symmetrically disposed repeatedly with respect to the source region 23a and the drain region 23b. Moreover, the predetermined number of identical memory cell transistors is repeated in a direction of the II-II' section line.

Next, an operation method of the memory cell transistor illustrated in FIGS. 1A to 1D will be described in further detail with reference to FIG. 1B. The operation method includes an erase step during which charge is injected on the floating gate 7a through the first gate insulation layer 5, a read step during which a change of the threshold voltage is sensed in a channel region of the bottom of the floating gate 7a by the charge stored in the floating gate 7a, and a write step through the second gate insulation layer 9 inducing tunneling of the charge stored in the floating gate 7a through the second gate insulation layer 9. In the detailed description of the present invention, the erase step and the write step are defined as above, but the meanings of the definitions are mutually interchangeable. That is, the injecting of the charge on the floating gate 7a through the first gate insulation layer 5 can be defined as the write step, and the inducing of the tunneling of the charge stored in the floating gate 7a through the second gate insulation layer 9 can be defined as the erase step. The definitions are assigned based on which standard of erasing and writing is used.

Specifically, referring to FIG. 1B, during the erasing, writing, and reading of the memory cell transistor, a source voltage $V_S$, a bit line voltage $V_{BL}$, a first select voltage $V_{SL1}$, a second select voltage $V_{SL2}$, and a word line voltage $V_{WL}$, which are, respectively, applied to the source region 23a, the drain region 23b, the first and second sidewall selection gate lines 11a and 11b, and the word line 19, can have values such as in the following table 1.

TABLE 1

|  | $V_{SL1}$ | $V_{SL2}$ | $V_{WL}$ | $V_{BL}$ | $V_S$ |
| --- | --- | --- | --- | --- | --- |
| Erase step | 2 V | 2 V | 16 V | 0.4 V | 0 V |
| Write step | 0 V | 16 V | 0 V | Floating | Floating |
| Read step | 2 V | 2 V | Reference voltage ($V_{CC}$) | 0.6 V | 0 V |

Referring to Table 1, during the erase step, a 0 V ground voltage, a 0.4 V bias voltage, a 2 V turn-on voltage, and a 16 V erase voltage are applied, respectively, to the source region 23a, the drain region 23b, the first and second sidewall selection gate lines 11a and 11b, and the word line 19. Therefore, hot carriers are injected along the direction of arrow ① through the first gate insulation layer 5. This method is different from the erasing method of a non-volatile memory device of a stack type.

During a write step, the 0V ground voltage is applied to the word line 19, and the source region 23a and the drain region 23b are floated. The 0V ground voltage is applied to one of the first and second sidewall selection gate lines 11a and 11b and the 16V write voltage is applied to the other. When the write voltage is applied to the first sidewall selection gate line 11a and the ground voltage is applied to the second sidewall selection gate line 11b, the charge tunnels through the second gate insulation layer 5 along the direction of arrow ②. On the contrary, when the write voltage is applied to the second sidewall selection gate line 11b and the ground voltage is applied to the first sidewall selection gate line 11a, the charge tunnels through the second gate insulation layer 5 along the direction of arrow ③.

During the write step, since one sidewall selection gate line on which the writing is performed and an opposite sidewall selection gate line to which the ground voltage is applied are disposed with the floating gate 7a therebetween, a float voltage inside the floating gate 7a does not greatly increase when compared to the case in which there is no opposite sidewall selection gate line to which the ground voltage is applied. Thus, the difference between the write voltage and the float voltage becomes larger, and write (program) efficiency increases.

On the other hand, during the read step, data (information) according to whether the charge is stored in the floating gate 23a is sensed by applying a 2V turn-on voltage, a reference voltage $V_{CC}$, a 0.6V read voltage, and a 0V ground voltage to the first and second sidewall selection gate lines 11a and 11b, the word line 19, the drain region 23b, and the source region 23a, respectively.

Figure 9:
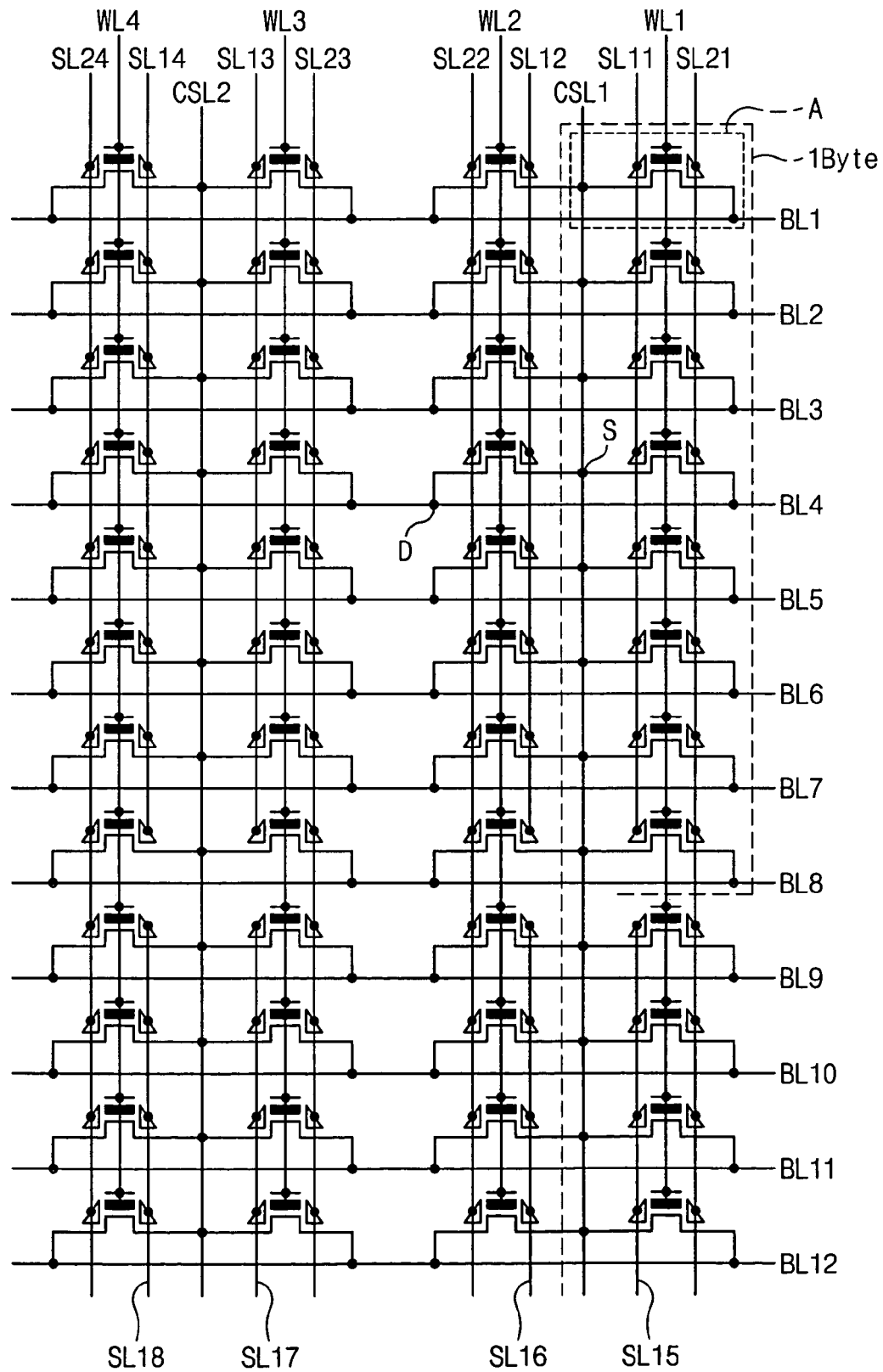
FIG. 9 is an equivalent circuit diagram illustrating a cell array of a non-volatile memory device according to an embodiment of the present invention.

FIG. 9 is an equivalent circuit diagram illustrating a cell array of a non-volatile memory device according to an embodiment of the present invention.

Referring to FIGS. 1A and 9, an array of memory devices includes a plurality of unit memory cells arranged in a row and in a column. Each of the unit memory cells shares the source region S in FIG. 9 and 23a in FIG. 1D and the drain region D in FIG. 9 and 23b in FIG. 1D with other memory cells adjacent to the unit memory cell in both directions of the row and the column, respectively. Accordingly, adjacent memory cells are symmetrically disposed in the row direction. The unit memory cell includes a floating gate 7a on the channel region defined between the source region S in FIG. 9 and 23a in FIG. 1D, sidewall selection gate lines SL11, SL12, SL13, SL14, SL15, SL16, SL17, SL18, SL21, SL22, SL23 and SL24 of sidewall selection gates 11a and 11b of both sides of the floating gate 7a, and word line WL1, WL2, WL3 and WL4 of the control gate of the top of the floating gate 7a. The source regions S of the unit memory cells are connected in a column direction, and compose common source lines CSL1 and CSL2. Moreover, the drain regions are connected in a row direction and compose a plurality of bit lines BL1 to BL12.

Next, the sidewall selection gates and the control gates of the unit memory cell compose first sidewall selection gate lines SL11, SL12, SL13, SL14, SL15, SL16, SL17 and SL18, second sidewall selection gate lines SL21, SL22, SL23 and SL24 and word lines WL1, WL2, WL3 and WL4. The first sidewall selection gate lines SL11, SL12, SL13, SL14, SL15, SL16, SL17 and SL18 are divided to connect the first sidewall selection gates of the predetermined number of memory cell transistors, which is, for example, eight memory cell transistors (one byte).

The second sidewall selection gate lines SL21, SL22, SL23 and SL24 are divided into the predetermined number of the memory cell units like the first sidewall selection gate lines SL11, SL12, SL13, SL14, SL15, SL16, SL17 and SL18. At this time, the first sidewall selection gate lines SL11, SL12, SL13, SL14, SL15, SL16, SL17 and SL18 are not divided into the memory cell unit and then can be continuously connected.

In the cell array structure, it is possible to write selectively the memory cells sharing the first sidewall selection gate lines. An operation of the device with a cell array selects each unit cell, erases and reads the unit cell, and selectively writes the predetermined number of unit cells.

During an erase step, hot carriers are injected on the floating gate 7a of the corresponding memory cell A to erase by applying the ground voltage, the bias voltage, and the turn-on voltage, the turn-on voltage and the erase voltage to the select common source line CSL1, the select bit line BL1, the first sidewall selection gate line SL11, the second sidewall selection gate line SL21, and the select word line WL1 connected to the selected memory cell A, respectively, and also applying the 0 V ground voltage to the common source line CSL2, the bit lines BL2 to BL12, the first and second sidewall selection gate lines SL12, SL13, SL14, SL15, SL16, SL17, SL18, SL22, SL23 and SL24, and the word lines WL2, WL3 and WL4, which are not selected.

During the above erase step, a memory cell disposed along a column on the bottom of the selected memory cell A includes the bit line BL2, the word line WL1, the sidewall selection gate lines SL11 and SL21, and the common source line CSL1. In this case, although a voltage identical to that of the selected memory cell A is applied to the word line WL1, the side selection gate lines SL11 and SL12, and the common source line CSL1, the memory cell is not injected with hot carrier and then not erased since the ground voltage is applied to the bit line BL2.

During the above erase step, a memory cell opposite the selected memory cell A along a row includes the bit line BL1, the word line WL2, the sidewall selection gate lines SL22 and SL12, and the common source line CSL1. In this case, although the bias voltage is identical to that of the selected memory cell A, the memory cell is not erased since the ground voltage is applied to the word line WL2, the sidewall selection gate lines SL22 and SL12 and the common source line CSL1.

During a write step, for example, a 16 V write voltage is applied to the first sidewall selection gate line SL11 connected to selected one byte memory cells. The common source lines CSL1 and CSL2 and the bit lines BL1 to BL12 are floated, and the 0 V ground voltage is applied to the word lines WL1 to WL4, and unselected first and second sidewall selection gate lines SL12, SL13, SL14, SL15, SL16, SL17, SL18, SL21, SL22, SL23 and SL24. Thus, the memory cells of one byte can be written at the same time.

During the above write step, memory cells disposed on the bottom of the selected one byte memory cell along a column include the bit lines BL9 to BL12, the word line WL1, the sidewall selection gate lines SL15 and SL21, and the common source line CSL1. In this case, although a voltage identical to that of the selected one byte memory cells is applied to the word line WL1, the second sidewall selection gate line SL21 and the common source line CSL1, the memory cell is not written since the ground voltage is applied to the bit lines BL9 to BL12 and the first sidewall selection gate line SL15.

During the above write step, memory cells opposite to the selected one byte memory cells along a row include the bit lines BL1 to BL8, the word line WL2, the sidewall selection gate lines SL12 and SL22, and the common source line CSL1. In this case, although a voltage identical to that of the selected one byte memory cell is applied to the common source line CSL1 and the bit lines BL1 to BL8, the memory cells are not written since the 0V ground voltage is applied to the word line WL2 and the sidewall selection gate lines SL22 and SL12.

During the write and erase steps, it is possible to prevent the adjacent memory cells from being written and erased using the sidewall selection gate lines. Therefore, distribution of a threshold voltage of the cells can be improved.

The eight memory cell transistors (one byte) are used to illustrate the embodiment of the present invention, but according to the grouping of the first sidewall selection gate lines SL11, SL12, SL13, SL14, SL15, SL16, SL17 and SL18, the write step can be simultaneously performed in other units of memory cells such as a single bit unit or as a one page unit.

FIGS. 2 to 8 are perspective views illustrating a method of forming the non-volatile memory device.

Figure 2:
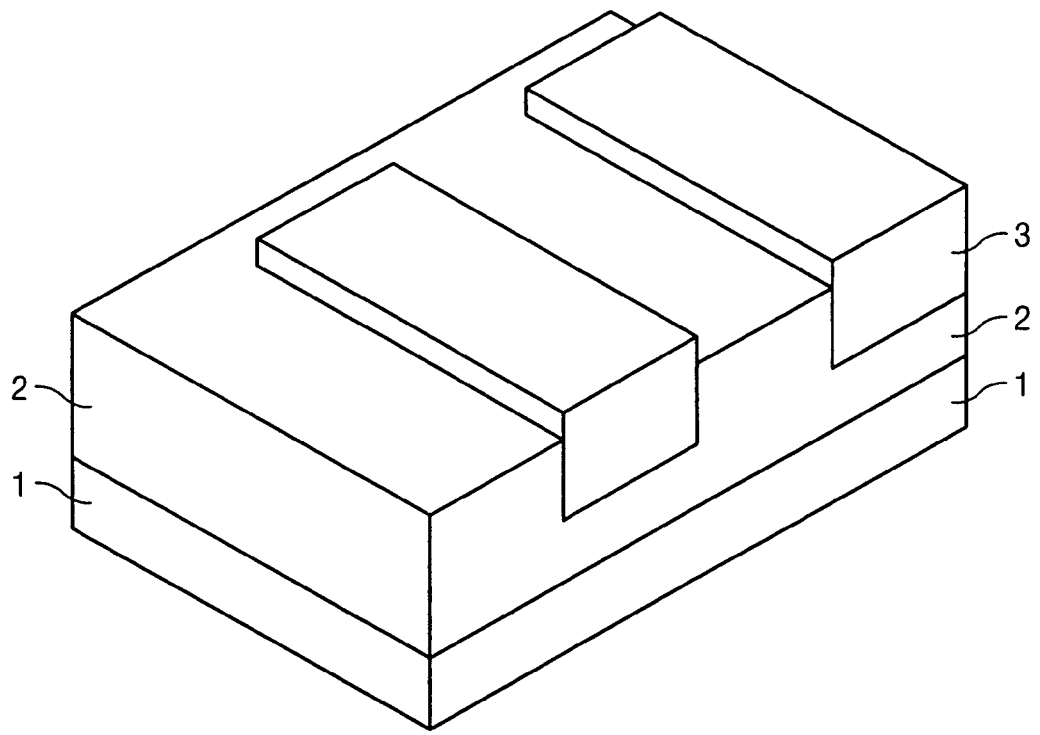
FIGS. 2 to 8 are perspective views illustrating a method of forming the non-volatile memory device.

Referring to FIG. 2, a well 2 is formed on a semiconductor substrate 1. For example, the semiconductor substrate can be doped with a P-type impurity of a low concentration, and the well can be doped with a P-type impurity of a high concentration. A device isolation layer 3 is formed on the semiconductor substrate 1, on which the well 2 is formed, to define an active region. The device isolation layer 3 can be formed using a conventional shallow trench isolation method.

Figure 3:
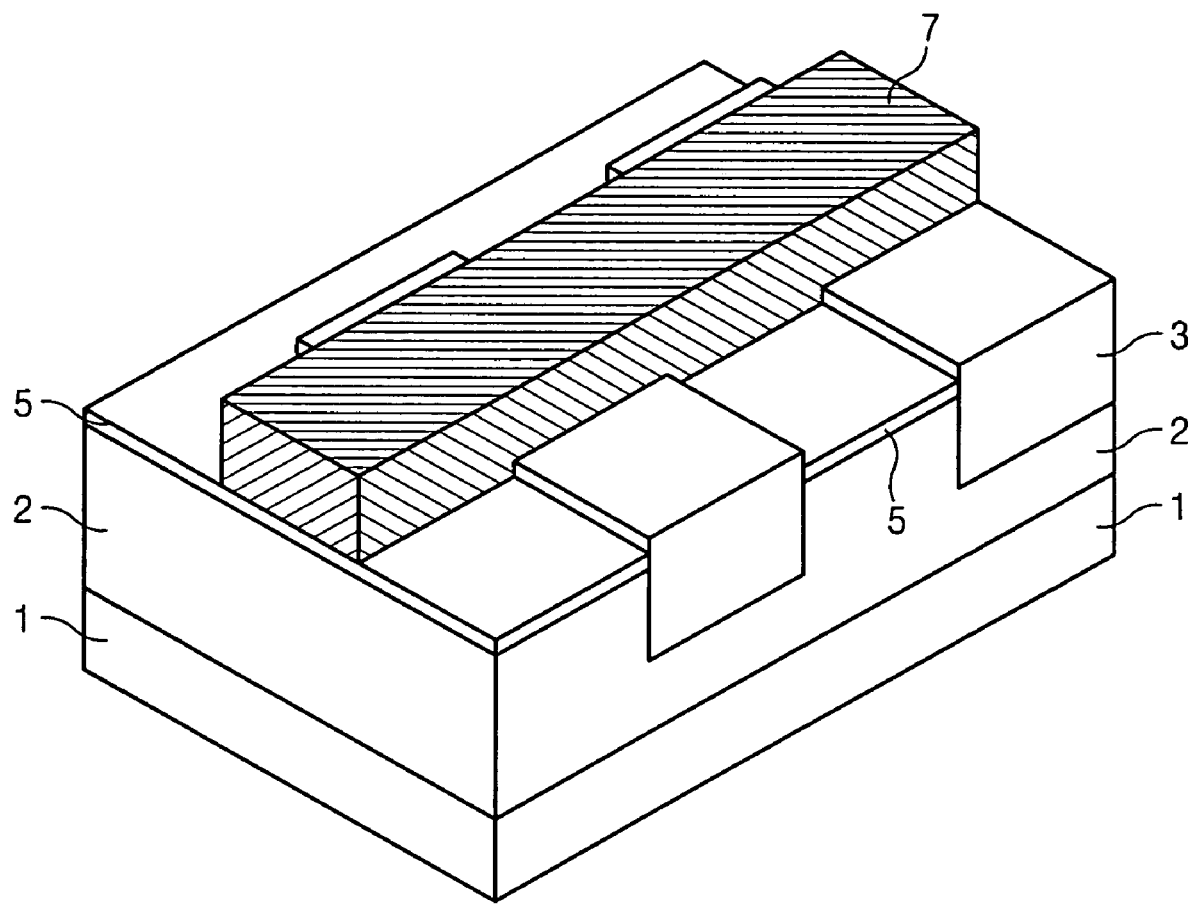

Referring to FIG. 3, a first gate insulation layer 5 is formed on the semiconductor substrate 1 of the active region. The first gate insulation layer 5 is formed of a thermal oxide layer by a CVD oxide layer or a thermal oxide process using a deposition process such as chemical vapor deposition (CVD). A floating gate layer (not shown) is formed on an entire surface of the semiconductor substrate 1 on which the first gate insulation layer 5 is applied. The floating gate layer, for example, can be formed of a polysilicon layer doped with an impurity. Using a first photoresist pattern (not shown) as an etching mask, the floating gate layer (not shown) is etched to form a floating gate pattern 7 crossing over the active region and the device isolation layer 3.

Figure 4:
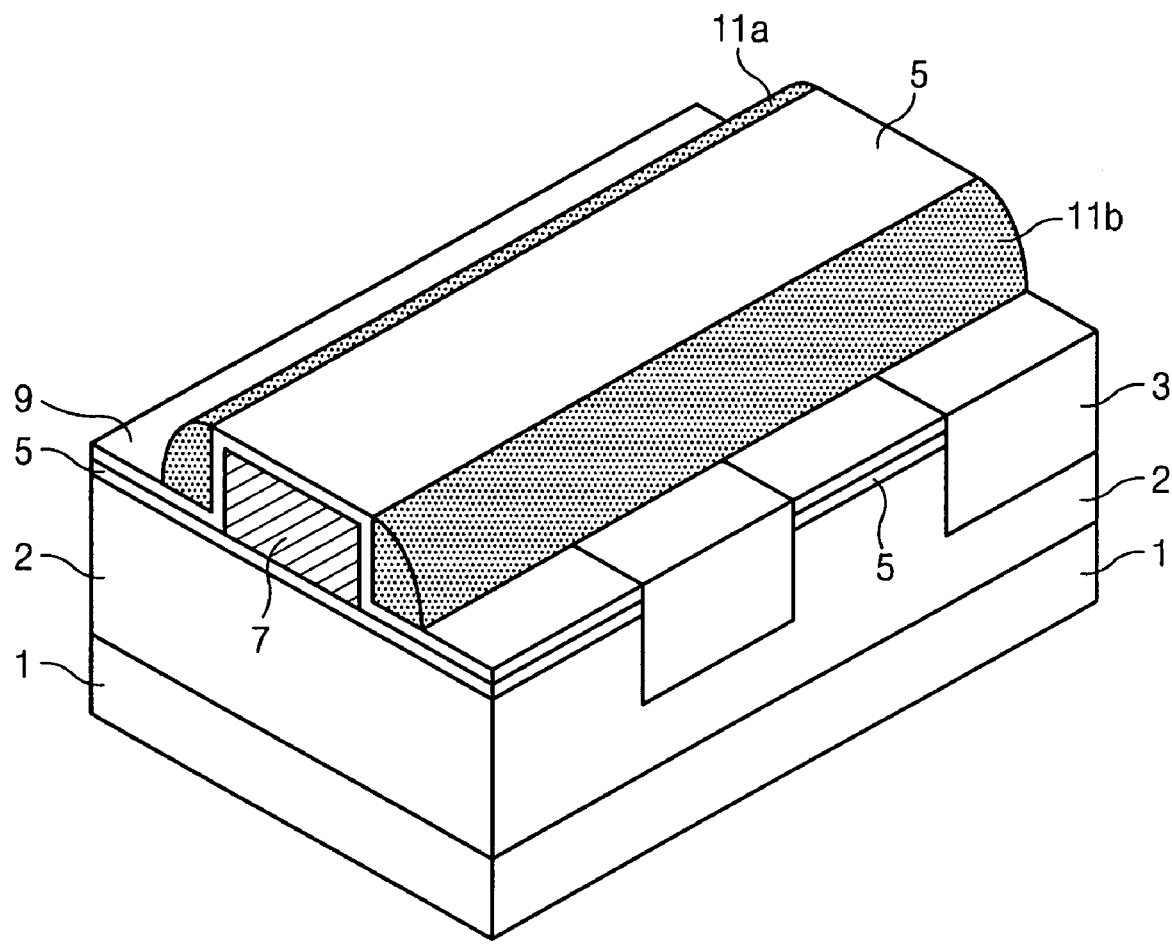

Referring to FIG. 4, a second gate insulation layer 9 is formed on the semiconductor substrate 1 on which the floating gate pattern 7 is formed. The second gate insulation layer 9 is formed of a thermal oxide layer by a CVD oxide layer or a thermal oxide process using a deposition process such as CVD. The second gate insulation layer 9 prevents charge from moving toward the sidewall selection gate lines 11a and 11b subsequently by the first and second gate insulation layer 5 and 9 in both sides of the floating gate pattern 7 during an erase operation. A sidewall selection gate layer (not shown) is conformally formed on the semiconductor substrate 1, and a first sidewall selection gate line 11a and a second sidewall selection gate line 11b, which cover a respective sidewall of the second gate insulation layer 9, are formed on both sides of the floating gate pattern 7 by an anisotropic etching process. The sidewall selection gate layer (not shown), for example, can be formed of a poly silicon doped with an impurity. Since the sidewall selection gate lines 11a and 11b are formed in a spacer form by an anisotropic etching process, the formation process is relatively simple and the degree of integration of cells can be improved.

Figure 5:
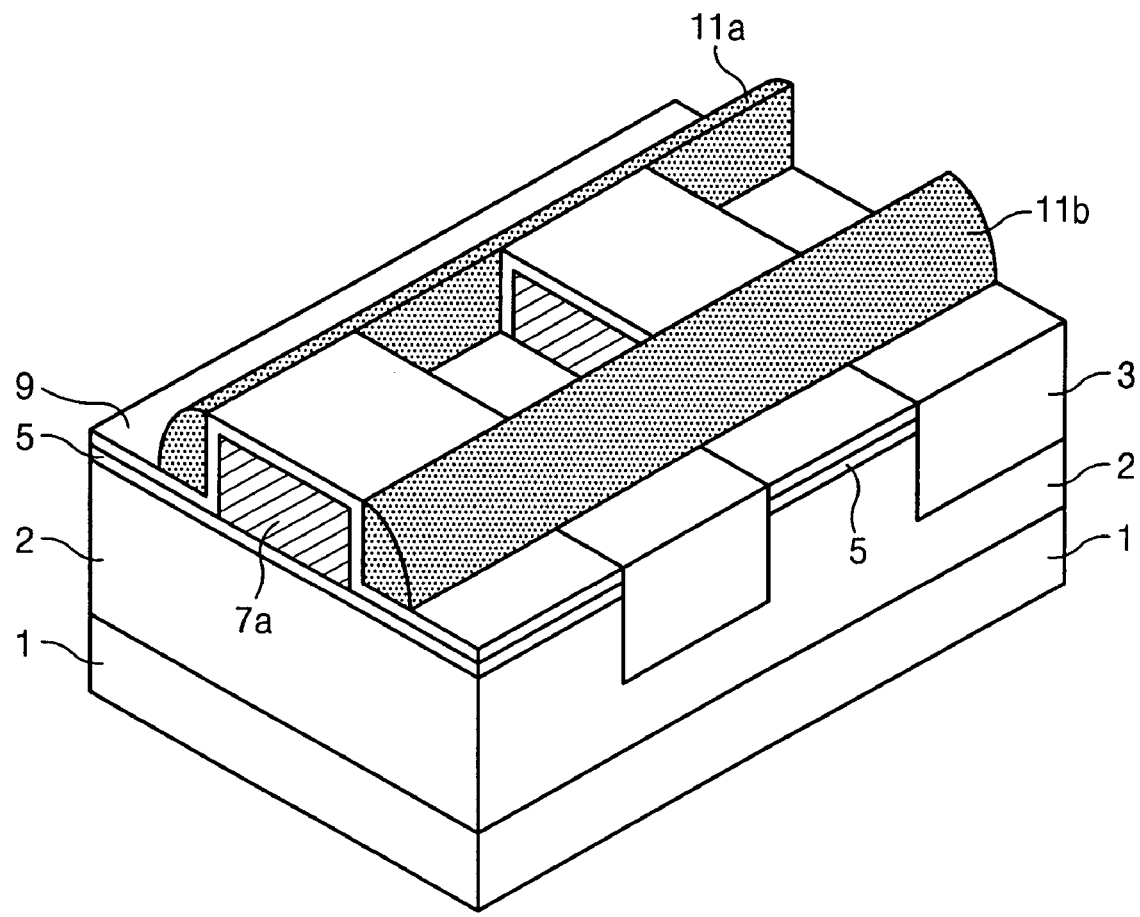

Referring to FIG. 5, using a second photoresist pattern (not shown), which includes an opening (not shown) that exposes the second gate insulation layer 9 on the device isolation layer 3, as an etching mask, the second gate insulation layer 9 exposed by the opening and the floating gate pattern 7 are sequentially etched to expose the device isolation layer 3 and simultaneously form a plurality of floating gates 7a that are spaced apart from each other. At this point, the first and second sidewall selection gate lines 11a and 11b are not etched. The second photoresist pattern (not shown) is removed.

Figure 6:
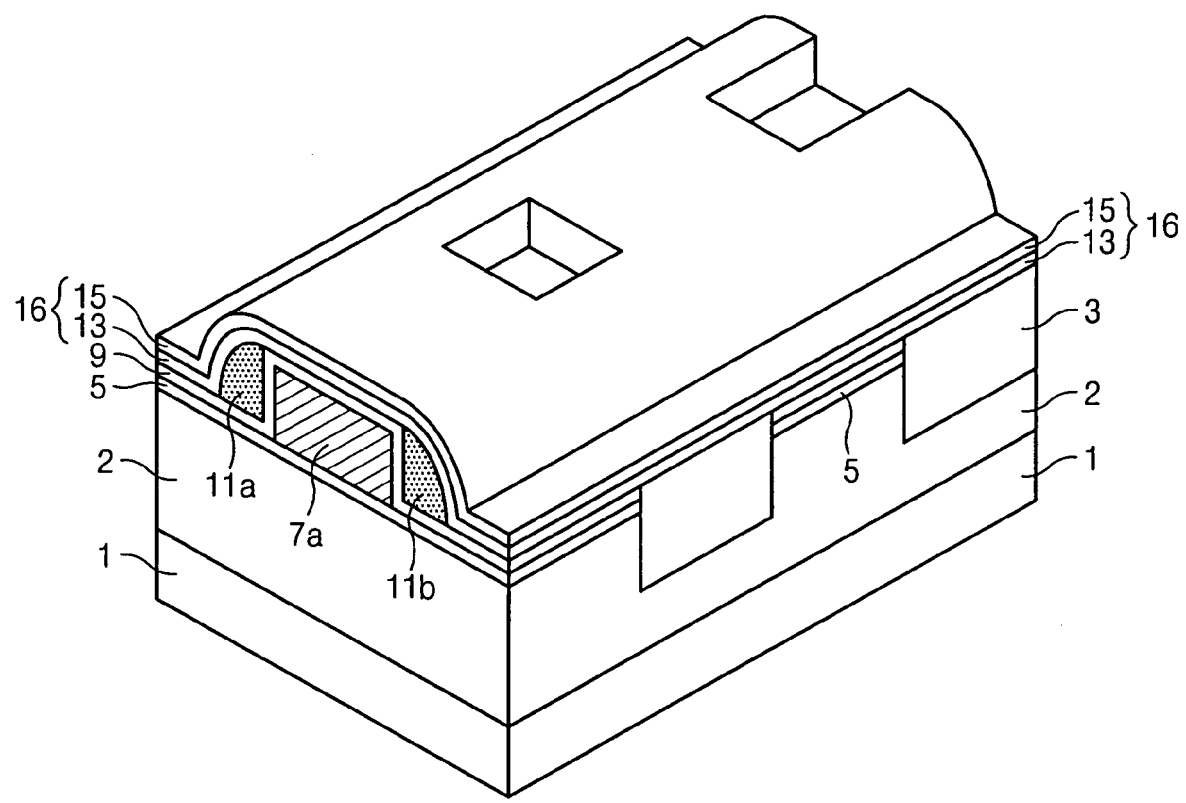

Referring to FIG. 6, an inter-gate dielectric layer 16 is conformally stacked on an entire surface of the semiconductor substrate 1 on which the plurality of floating gates 7a are formed on. The inter-gate dielectric layer 16 can be formed by sequentially stacking a silicon nitride layer 13 and a silicon oxide layer 15.

Figure 7:
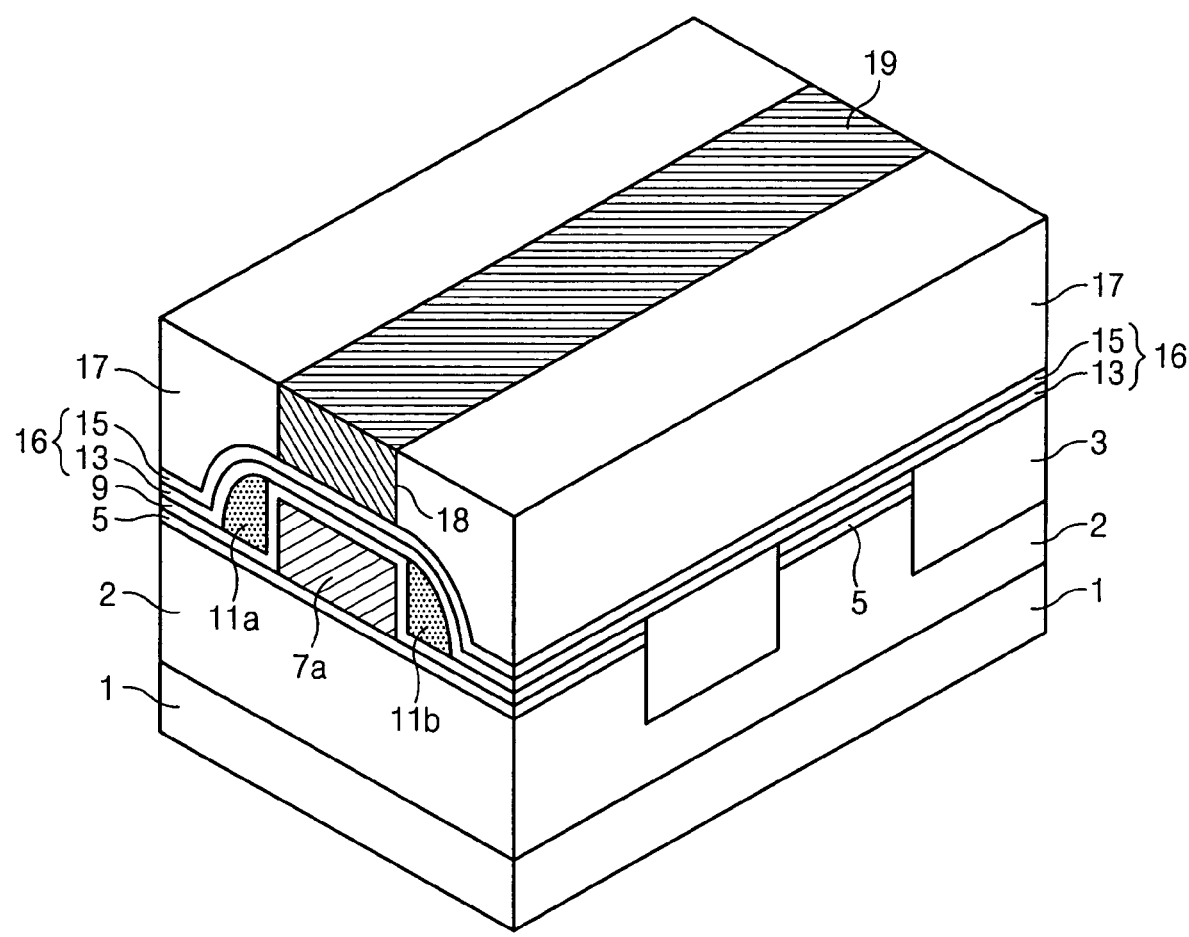

Referring to FIG. 7, a sacrificial layer 17 is formed on an entire surface of the semiconductor substrate 1. The sacrificial layer 17, for example, can be formed of a silicon oxide layer or silicon nitride layer. A groove 18 is formed to expose the inter-gate dielectric layer 16 between the sidewall selection gate lines 11a and 11b by patterning the sacrificial layer 17. The groove 18 is filled by stacking a control gate layer (not shown) on an entire surface of the semiconductor substrate 1. By performing a planarization process on the control gate layer to expose the top of the sacrificial layer 17, a word line 19 is formed inside the groove 18 at the same time. The control gate layer can be formed of at least one material selected from the group consisting of poly silicon, tungsten, tungsten silicide, and a tungsten nitride, which are doped with an impurity.

Figure 8:
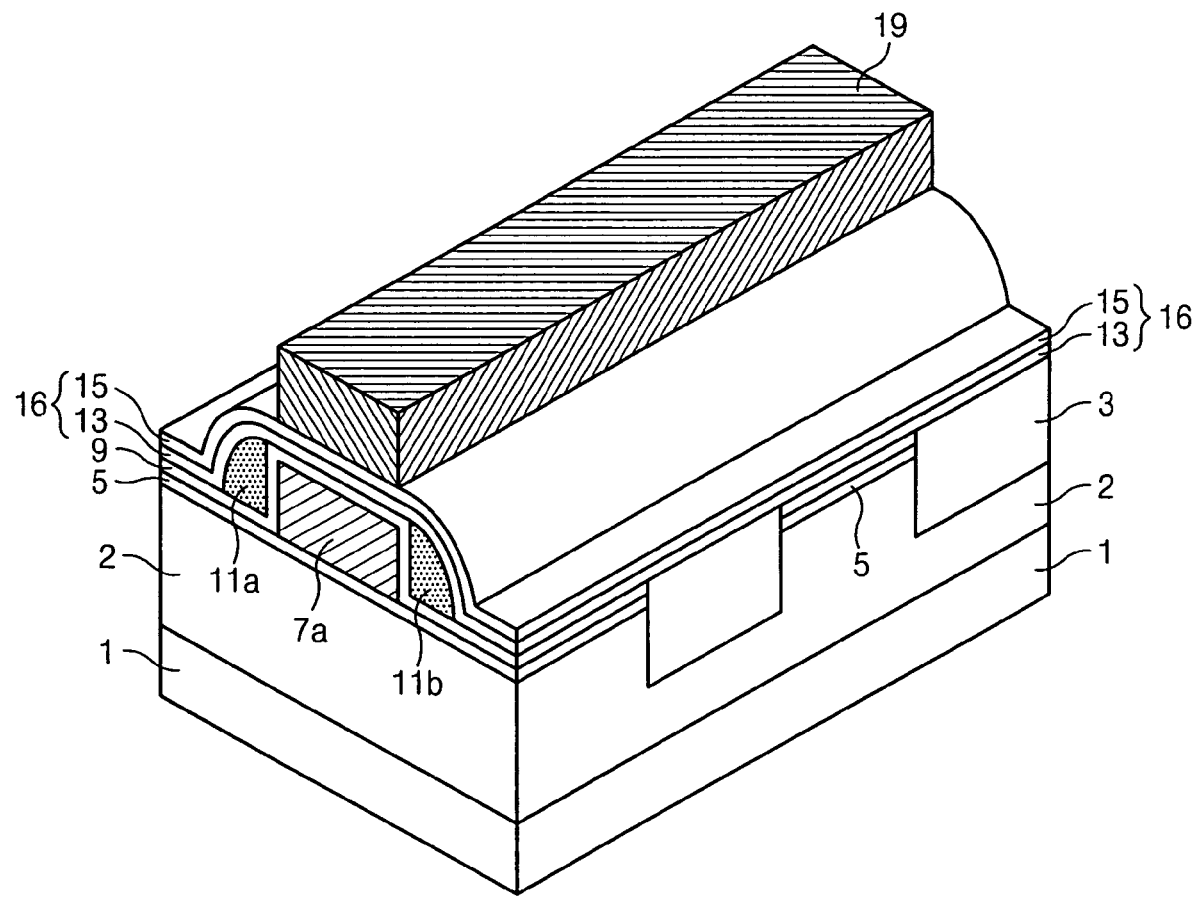

Referring to FIG. 8, a sidewall of the word line 19 is exposed on the inter-gate dielectric layer 16 by selectively removing the sacrificial layer 17. The sacrificial layer 17, for example, can be removed by a wet etching process using a phosphoric acid and a nitric acid.

Next, referring to FIG. 1A, a spacer layer (not shown) is conformally formed on an entire surface of the semiconductor substrate 1, and spacers 21 are formed to cover sidewalls of the word line 19 and the inter-gate dielectric layer 16 by performing an anisotropic etching on the spacer layer.

Accordingly, according to the present invention, since one memory transistor includes sidewall selection gates covering both sidewalls of a floating gate when the floating gate and a control gate are stacked, the degree of integration of cells is improved and, at the same time, write/erase errors common to the conventional memory devices are prevented. Therefore, distribution of a threshold voltage can be improved.

While this invention has been particularly shown and described with references to preferred embodiments thereof, it will be understood by those skilled in the art that various changes in form and details may be made herein without departing from the spirit and scope of the invention as defined by the appended claims.

What is claimed is:

1. A non-volatile memory device comprising a plurality of memory cell transistors, wherein each of the memory cell transistors comprises:
    a first gate insulation layer on a semiconductor substrate;
    a floating gate on the first gate insulation layer;
    a second gate insulation layer covering a top and sidewalls of the floating gate;
    a first sidewall selection gate on the second gate insulation layer at a first sidewall of the floating gate;
    a second sidewall selection gate on the second gate insulation layer at a second sidewall of the floating gate;
    an inter-gate dielectric layer on the first sidewall selection gate, the second gate insulation layer and the second sidewall selection gate;
    a control gate overlapping the floating gate on the inter-gate dielectric layer;
    a source region in the semiconductor substrate adjacent the first sidewall selection gate and spaced apart from the floating gate; and
    a drain region in the semiconductor substrate adjacent the second sidewall selection gate and spaced apart from the floating gate.

2. The non-volatile memory device of claim 1, wherein the first gate insulation layer under the first and second sidewall selection gates is thicker than the first gate insulation layer under the floating gate.

3. The non-volatile memory device of claim 1, wherein the second gate insulation layer is interposed between the first gate insulation layer and the first sidewall selection gate and between the first gate insulation layer and the second sidewall selection gate.

4. The non-volatile memory device of claim 1, wherein the first and second sidewall selection gates are formed of the same material and have a spacer shape.

5. The non-volatile memory device of claim 4, wherein: the plurality of memory cell transistors are arranged in a row direction and in a column direction; the drain regions of the memory cell transistors arranged in a row are connected to compose a bit line; the first sidewall selection gates of the memory cell transistors arranged in a column are connected to compose a first sidewall selection gate line; the second sidewall selection gates of the memory cell transistors arranged in a column are connected to compose a second sidewall selection gate line; the control gates of the memory cells arranged in a column are connected to compose a word line; and the source regions arranged in a column are connected to compose a common source line.

6. The non-volatile memory device of claim 5, wherein at least one of the first sidewall selection gate line and the second sidewall selection gate line is divided into a predetermined number of the memory cell transistor units.

7. A non-volatile memory device comprising:
a semiconductor substrate;
a gate insulation layer on the semiconductor substrate;
a floating gate on the gate insulation layer;
an inter-gate dielectric layer on the floating gate;
a control gate on the inter-gate dielectric layer, the control gate extending in a first horizontal direction of extension; and
first and second sidewall selection gates respectively covering sidewalls of the floating gate and insulated from the semiconductor substrate and the floating gate, the control gate having sidewalls that are spaced apart from, and between, the first and second sidewall selection gates in a second horizontal direction of extension that is transverse to the first horizontal direction of extension,
wherein at least one of the first and second sidewall selection gates forms a channel on the semiconductor substrate during a device operation.

8. The non-volatile memory device of claim 7, further comprising first and second insulative spacers respectively covering sidewalls of the control gate and on the inter-gate dielectric layer.

9. The non-volatile memory device of claim 7, wherein the inter-gate dielectric layer continuously extends from the first sidewall selection gate to the second sidewall selection gate.

10. A non-volatile memory device comprising:
a semiconductor substrate, a gate insulation layer, a floating gate, an inter-gate dielectric layer, and a control gate, wherein the gate insulation layer, the floating gate, the inter-gate dielectric layer, and the control gate are sequentially stacked on the semiconductor substrate;
first and second insulative spacers respectively covering sidewalls of the control gate and on the inter-gate dielectric layer; and
first and second sidewall selection gates respectively covering sidewalls of the floating gate and insulated from the semiconductor substrate and the floating gate, wherein at least one of the first and second sidewall selection gates forms a channel on the semiconductor substrate during a device operation.

* * * * *